United States Patent
Akarvardar et al.

(10) Patent No.: US 9,337,022 B1
(45) Date of Patent: May 10, 2016

(54) VIRTUAL RELAXED SUBSTRATE ON EDGE-RELAXED COMPOSITE SEMICONDUCTOR PILLARS

(71) Applicants: GLOBALFOUNDRIES Inc., Grand Caymay (KY); INTERNATIONAL BUSINESS MACHINES CORPORATION, Armonk, NY (US)

(72) Inventors: Murat Kerem Akarvardar, Saratoga Springs, NY (US); Jody A. Fronheiser, Delmar, NY (US); Bruce Doris, Slingerlands, NY (US)

(73) Assignees: GLOBALFOUNDRIES INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/742,471

(22) Filed: Jun. 17, 2015

(51) Int. Cl.
| | |
|---|---|
| *H01L 21/20* | (2006.01) |
| *H01L 21/02* | (2006.01) |
| *H01L 21/306* | (2006.01) |
| *H01L 21/304* | (2006.01) |
| *H01L 29/165* | (2006.01) |

(52) U.S. Cl.
CPC ........ *H01L 21/0245* (2013.01); *H01L 21/0251* (2013.01); *H01L 21/02381* (2013.01); *H01L 21/02433* (2013.01); *H01L 21/02532* (2013.01); *H01L 21/02609* (2013.01); *H01L 21/304* (2013.01); *H01L 21/30604* (2013.01); *H01L 29/165* (2013.01)

(58) Field of Classification Search
CPC ............ H01L 21/0245; H01L 21/0251; H01L 21/02532; H01L 21/02647
See application file for complete search history.

(56) References Cited

U.S. PATENT DOCUMENTS

| | | | |
|---|---|---|---|
| 6,380,108 B1 * | 4/2002 | Linthicum et al. | H01L 21/02639 438/791 |
| 2001/0008791 A1 * | 7/2001 | Gehrke et al. | H01L 21/02647 438/481 |
| 2003/0092263 A1 * | 5/2003 | Koike et al. | H01L 21/02381 438/689 |
| 2013/0037857 A1 * | 2/2013 | Von Kanel et al. | H01L 21/02532 257/190 |

* cited by examiner

*Primary Examiner* — Bryan Junge
(74) *Attorney, Agent, or Firm* — William F. Reinke, Esq.; Heslin Rothenberg Farley & Mesiti P.C.

(57) ABSTRACT

A method of creating a virtual relaxed substrate includes providing a bulk semiconductor substrate, and creating a layer of strained semiconductor material on the substrate, a non-zero lattice mismatch of less than about 2% being present between the substrate and the layer of strained semiconductor material, and the layer of strained semiconductor material having a thickness of from about 50 nm to about 150 nm. The method further includes etching through the layer of strained semiconductor material and into the substrate to create shaped pillars separated by slits and sized to achieve edge effect relaxation throughout each shaped pillar, merging a top portion of the pillars with single crystal growth of epitaxial material to create a continuous surface while substantially maintaining the slits, and creating a virtual relaxed substrate by creating a layer of epitaxial composite semiconductor material over the continuous surface.

20 Claims, 5 Drawing Sheets

VIRTUAL RELAXED SUBSTRATE ON EDGE-RELAXED COMPOSITE SEMICONDUCTOR PILLARS

BACKGROUND OF THE INVENTION

1. Technical Field

The present invention generally relates to relaxed composite semiconductor materials. More particularly, the present invention relates to minimizing defect density in an active channel on top of a virtual relaxed substrate.

2. Background Information

Currently, relaxed silicon germanium buffer growth on bulk silicon is typically accomplished using defect generation techniques, for example, significantly exceeding the critical thickness of the channel, implanting an impurity (e.g., hydrogen, helium or argon) at the interface between the silicon germanium and the bulk silicon and annealing, or using thin relaxed germanium insertion, to name a few. However, while defect generation may achieve relaxation, the subsequent processing to reduce the defect density in the relaxed buffer as well as in the active channel on top of the buffer has been less successful.

Thus, a need continues to exist for a way to achieve relaxed buffer growth while minimizing defect density.

SUMMARY OF THE INVENTION

The shortcomings of the prior art are overcome and additional advantages are provided through the provision, in one aspect, of a method of creating a virtual relaxed substrate. The method includes providing a bulk semiconductor substrate, and creating a layer of strained semiconductor material on the substrate, a non-zero lattice mismatch of less than about 2% being present between the substrate and the layer of strained semiconductor material, and the layer of strained semiconductor material having a thickness of about 50 nm to about 150 nm. The method further includes etching through the layer of strained semiconductor material and into the substrate to create a plurality of shaped pillars separated by slits and sized to achieve elastic edge effect relaxation throughout each shaped pillar, merging a top portion of the plurality of pillars to create a continuous surface while substantially maintaining the slits, and creating a virtual relaxed substrate by creating a layer of epitaxial semiconductor material over the continuous surface.

In another aspect, an intermediate semiconductor device is provided. The device includes a bulk semiconductor substrate, and a plurality of shaped pillars separated by slits reaching into the substrate and sized to achieve elastic edge effect relaxation throughout each shaped pillar, the plurality of shaped pillars including strained semiconductor material having a non-zero lattice mismatch of less than about 2% with the substrate, the plurality of shaped pillars having a thickness of about 50 nm to about 150 nm, and a top portion of the plurality of pillars being merged to create a continuous surface while substantially maintaining the slits. The device further includes a virtual relaxed substrate including a layer of epitaxial composite semiconductor material over the continuous surface.

These, and other objects, features and advantages of this invention will become apparent from the following detailed description of the various aspects of the invention taken in conjunction with the accompanying drawings.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

The present invention uses edge relaxation (normally an undesired effect in semiconductor fabrication) to achieve relaxed buffer growth on a bulk semiconductor substrate as an alternative to relaxation approaches based on intentional defect generation. Edge relaxation can occur at the edges of a top layer of semiconductor material having a lattice mismatch with the bulk substrate directly below the top layer. By creating the top layer on pillars sized small enough and with free surfaces at the edges, to achieve relaxation throughout, intentional defect generation is avoided.

Figure 1:
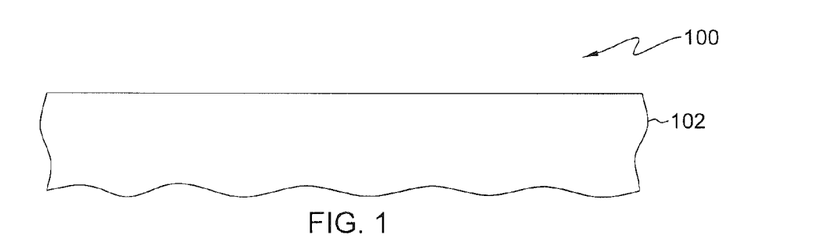
FIG. 1 is a cross-sectional view of one example of a starting semiconductor structure, the structure including a bulk semiconductor substrate, in accordance with one or more aspects of the present invention.

FIG. 1 is a cross-sectional view of one example of a starting semiconductor structure 100, the structure including a bulk semiconductor substrate 102, in accordance with one or more aspects of the present invention.

The starting structure may be conventionally fabricated, for example, using known processes and techniques. In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
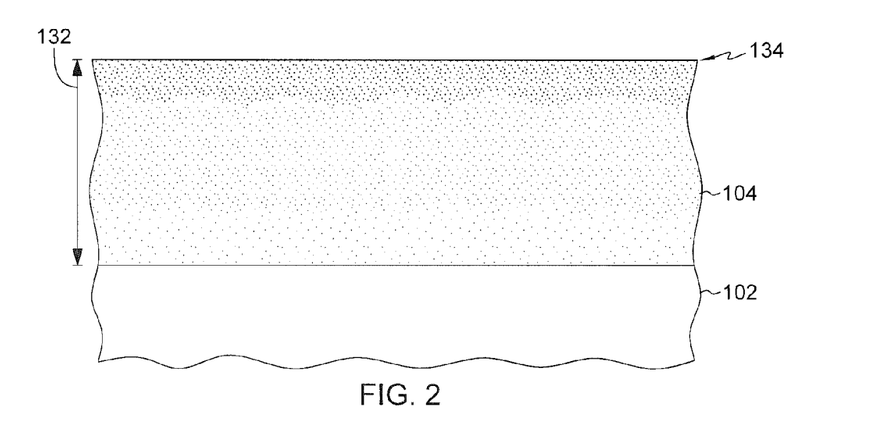
FIG. 2 depicts one example of the starting structure of FIG. 1, after creating a layer of strained composite semiconductor material on the substrate, e.g., silicon germanium (SiGe) with a bulk silicon substrate, in accordance with one or more aspects of the present invention.

FIG. 2 depicts one example of the starting structure of FIG. 1, after creating a layer 104 of strained composite semiconductor material on the substrate, e.g., silicon germanium with a bulk silicon substrate, in accordance with one or more aspects of the present invention.

The layer of strained composite semiconductor material may have, in one example, a thickness 132 of from about 50 nm to about 150 nm, and may be graded or ungraded. Where the strained composite layer is graded, in one example using silicon germanium, the gradation increases from zero or near zero percent germanium at an interface with the substrate 102 to a percent germanium of from about 20% to about 40% at a top 134 thereof. Where the strained composite layer is ungraded, the percent germanium substantially throughout is about half the average upper limit for the graded scenario. In the present example, the percent ungraded germanium in the composite is about [(40+20/2)/2=]15%.

Figure 3:
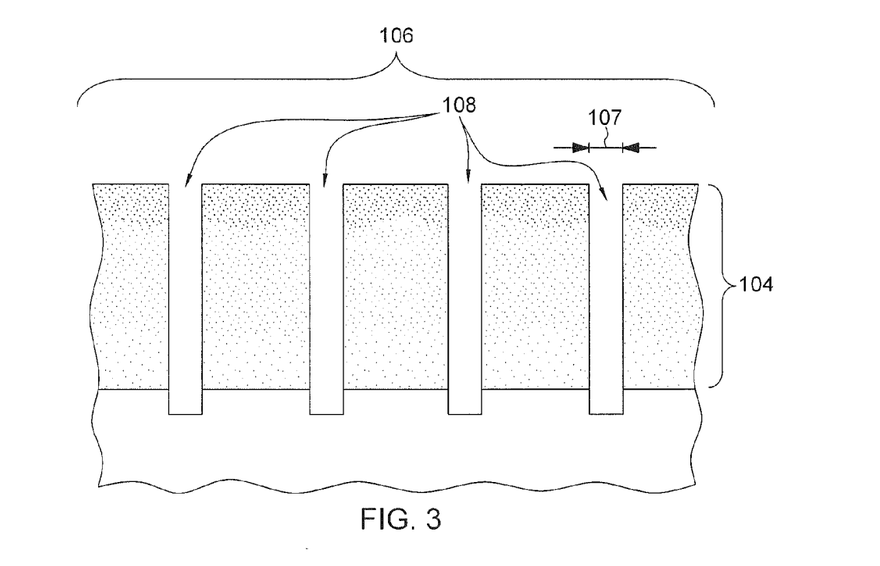
FIG. 3 depicts one example of the structure of FIG. 2 after etching through the layer of strained composite semiconductor material and into a top portion of the substrate, the etching creating shaped pillars separated by slits in a pattern, the pillars sized to relax completely or substantially completely due to the edge effect in all directions, in accordance with one or more aspects of the present invention.

FIG. 3 depicts one example of the structure of FIG. 2 after etching through the layer 104 of strained composite semiconductor material and into a top portion of the substrate, the etching creating shaped pillars 106 separated by slits 108 in a pattern (see FIG. 4), the pillars sized to relax completely or substantially completely due to the edge effect in all directions, in accordance with one or more aspects of the present invention.

In one example, where the substrate 102 is bulk silicon, the strained composite layer may include, for example, silicon germanium (graded or ungraded germanium) and may have a thickness (132, FIG. 2) of from about 50 nm to about 150 nm and the pillars 106 may be square shaped, full or substantially full relaxation of the pillars due to the edge effect may be achieved with, for example, a non-zero pillar width of about 100 nm or less and a slit 108 width of from about 5 nm to about 20 nm.

Figure 4:
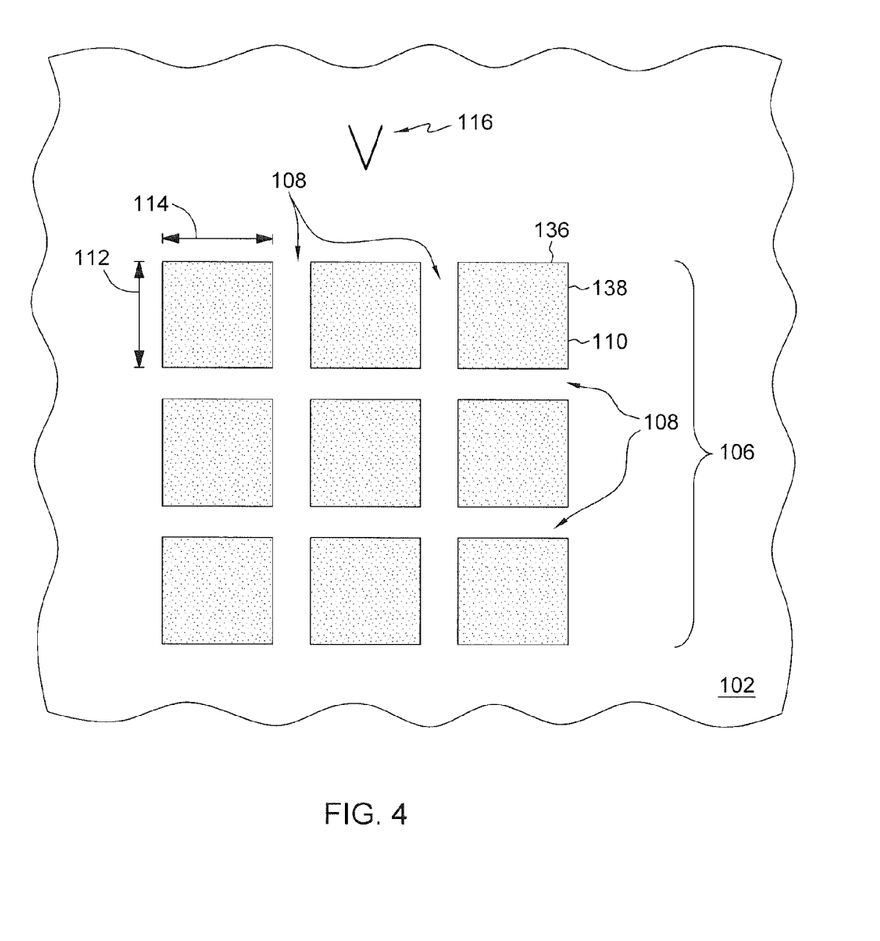
FIG. 4 is a top-down view of one example of the structure of FIG. 3, showing (in this example) square shaped pillars aligned with a notch in the substrate, and having about 100 nm dimensions, the slits creating a hash pattern, which pattern may be replicated across the entire substrate, in accordance with one or more aspects of the present invention.

FIG. 4 is a top-down view of one example of the structure of FIG. 3, showing (in this example) square shaped pillars (e.g., square shaped pillar 110) aligned with a notch 116 in the substrate, and having about 100 nm dimensions, the slits 108 creating a hash pattern, which pattern may be replicated across the entire substrate, in accordance with one or more aspects of the present invention.

In one example, the pillar sidewalls (e.g., sidewalls 136 and 138 of pillar 110) are oriented to notch 116 in the substrate, such that the pillar sidewalls have a (110) orientation and the substrate has a (100) orientation.

Figure 5:
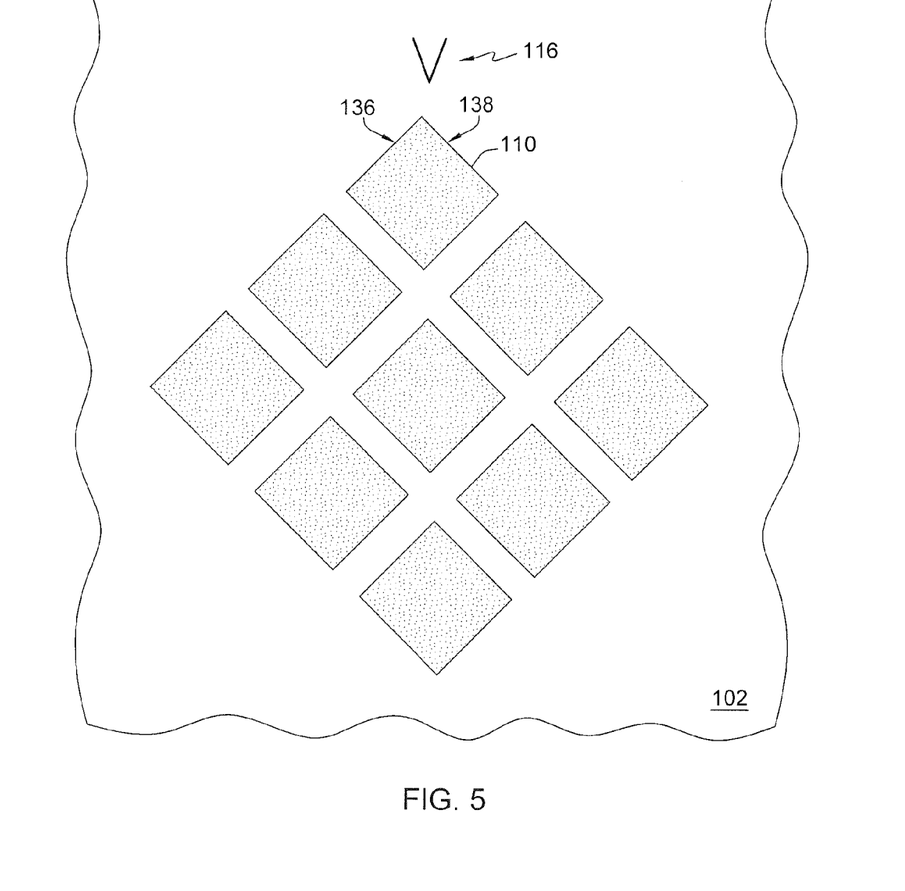
FIG. 5 depicts one alternative example of the structure of FIG. 4 where the pillars (and slit pattern) are rotated 45 degrees with respect to the substrate notch, as compared to FIG. 4, in accordance with one or more aspects of the present invention.

FIG. 5 depicts one alternative example of the structure of FIG. 4 where the pillars 106 (and slit pattern) is rotated 45 degrees with respect to the substrate notch 116, as compared to FIG. 4, in accordance with one or more aspects of the present invention.

With the pillars rotated as described above with respect to notch 116, the pillar sidewalls (e.g., sidewalls 136 and 138 of pillar 110) will have a (100) orientation where the substrate has a (100) orientation. Note that, as between FIGS. 4 and 5, the (100) orientation of the FIG. 5 sidewalls will have lower defect density when a subsequent merger of top portions of the pillars takes place (see FIG. 6). In addition, applicable generally, the pillars need not be square, but may have any shape, for example, a circle shape or a hexagon shape.

Figure 6:
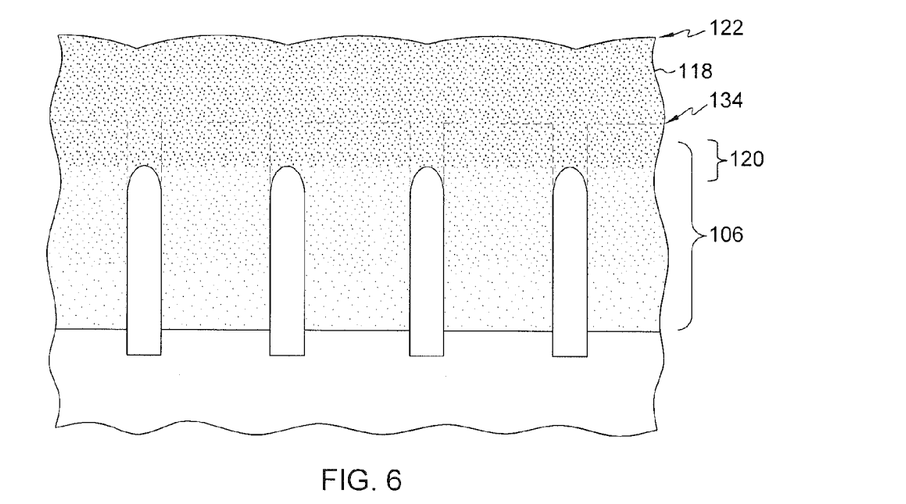
FIG. 6 depicts one example of the structure of FIG. 4 or 5 after a layer of epitaxial composite semiconductor material is created on the pillars, which also serves to merge top portions of the pillars while minimizing filling of the slits with the epitaxial composite material, creating a continuous surface across the structure, in accordance with one or more aspects of the present invention.

FIG. 6 depicts one example of the structure of FIG. 4 or 5 after a layer of epitaxial composite semiconductor material is created on the pillars, which also serves to merge top portions of the pillars while minimizing filling of the slits with the epitaxial composite material, creating a continuous surface across the structure, in accordance with one or more aspects of the present invention. In one example, the layer of epitaxial composite semiconductor material on the pillars includes single crystal epitaxial growth.

Preferably, a same composite semiconductor material is used for the pillars and the epitaxial composite material creating the continuous surface over the pillars. In one example, the composite material of the pillars is an epitaxial composite (obtained, e.g., by growing) comprising the semiconductor material of the substrate and at least one other semiconductor material. Preferably, a percentage of the at least one other semiconductor material in the epitaxial composite at a top surface 134 of the pillars is a same percentage as that of the material creating layer 118, resulting in the continuous surface over the pillars. The slits between the pillars serve to allow the material over the pillars to be fully or substantially fully relaxed, since the pillars themselves at the top 134 are also relaxed or substantially relaxed.

Figure 7:
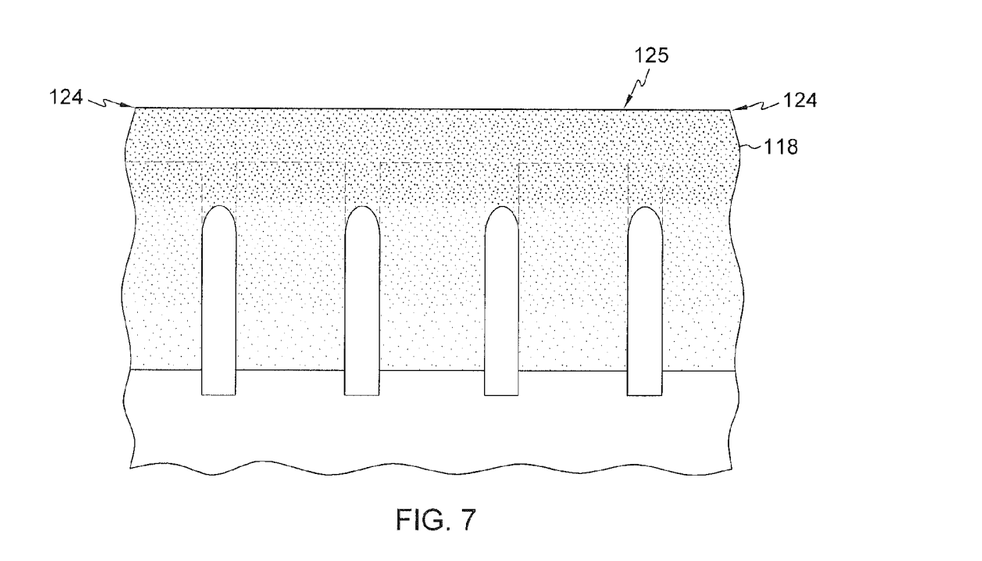
FIG. 7 depicts one example of the structure of FIG. 6 after planarization of the layer of epitaxial composite semiconductor material creating the continuous surface, in accordance with one or more aspects of the present invention.

FIG. 7 depicts one example of the structure of FIG. 6 after planarization 124 of the layer 118 of epitaxial composite semiconductor material creating the continuous surface (here, planarized surface 125), in accordance with one or more aspects of the present invention.

In one example, planarization of the layer 118 of epitaxial composite semiconductor material may be accomplished using a conventional chemical-mechanical polish.

Figure 8:
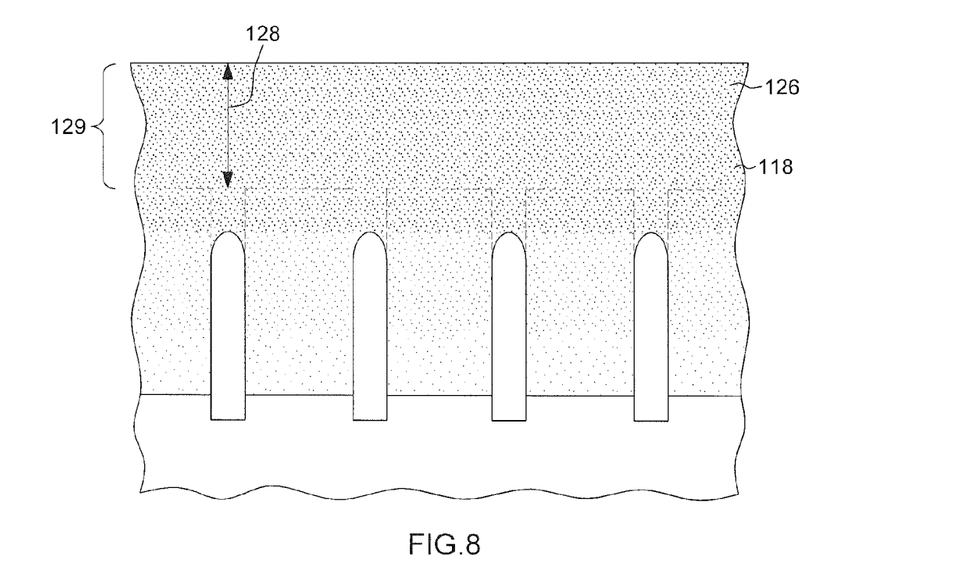
FIG. 8 depicts one example of the structure of FIG. 7 after creating another layer of the epitaxial composite semiconductor material on the planarized surface, the another layer having a thickness sufficient for the combined thickness of the layers over the pillars to serve as a virtual substrate for fabrication of one or more semiconductor devices, in accordance with one or more aspects of the present invention.

FIG. 8 depicts one example of the structure of FIG. 7 after creating another layer 126 of the epitaxial composite semiconductor material on the planarized surface 125, the another layer having a thickness sufficient for the combined thickness 128 of the layers (118, 126) over the pillars to serve as a virtual substrate 129 for fabrication of one or more semiconductor devices, in accordance with one or more aspects of the present invention.

Due to the planarization of the epitaxial composite layer 118 described with respect to FIG. 7, an additional layer 126 or layers of the epitaxial composite material may be created on the initial planarized layer, such that the additional epitaxial composite layer(s) will normally be created as planarized. However, to the extent needed or desired, the additional layer(s) may be planarized. In one example, the additional layer(s) of epitaxial composite material may be planarized using a conventional chemical-mechanical polishing process. The thicknesses 128 of all the layers of epitaxial composite material together (129) are such as to allow their use as a virtual substrate for fabricating one or more semiconductor devices. In one example, where the substrate is bulk silicon, the epitaxial composite material may be silicon germanium, the layers together having a thickness 129 of from about 100 nm to about 200 nm for fabrication of one or more semiconductor devices, such as, for example, transistors. In the case of conventional non-planar (three-dimensional) transistors, the thickness of the SiGe virtual substrate may be such as to accommodate isolation material surrounding the raised semiconductor structures (raised with respect to substrate, e.g., fins).

Figure 9:
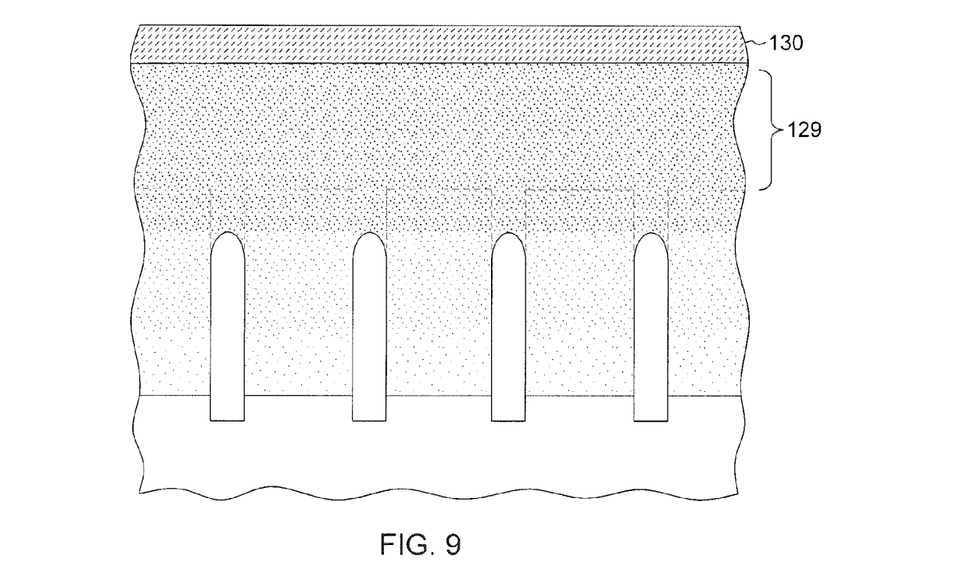
FIG. 9 depicts one example of the structure of FIG. 8 after creation of a layer of channel material over the virtual substrate, in accordance with one or more aspects of the present invention.

FIG. 9 depicts one example of the structure of FIG. 8 after creation of a layer 130 of channel material over the virtual substrate 129, in accordance with one or more aspects of the present invention.

In one example, the channel material of layer 130 may include tensily strained silicon having a thickness of, for example, from about 25 nm to about 50 nm. In another example, assuming the virtual substrate is silicon germanium, the channel material may include strained semiconductor material, for example, compressively strained silicon germanium having a higher percentage of germanium than that of the virtual substrate. In one example, the compressively strained silicon germanium may have about a 10% to about a 30% higher percentage of germanium than that of the virtual substrate. From this point, for example, a non-planar transistor may be fabricated using the virtual substrate.

In a first aspect, disclosed above is a method of creating a virtual relaxed substrate. The method includes providing a bulk semiconductor substrate, and creating a layer of strained semiconductor material on the substrate, a non-zero lattice mismatch of less than about 2% being present between the substrate and the layer of strained semiconductor material, and the layer of strained semiconductor material having a thickness of from about 50 nm to about 150 nm. The method further includes etching through the layer of strained semiconductor material and into the substrate to create a plurality of shaped pillars separated by slits and sized to achieve edge effect relaxation throughout each shaped pillar, merging a top portion of the plurality of pillars to create a continuous surface while substantially maintaining the slits, and creating a virtual relaxed substrate by creating a layer of epitaxial composite semiconductor material over the continuous surface.

In one example, creating the layer of epitaxial composite semiconductor material over the continuous surface, may include, for example, creating a first layer of epitaxial composite semiconductor material on the continuous surface, planarizing the first layer of epitaxial composite semiconductor material, and creating a second layer of epitaxial composite semiconductor material on the planarized first layer.

In one example, creating the layer of strained semiconductor material in the method of the first aspect may include, for example, creating a graded layer of a composite semiconductor material, the composite including a material of the bulk semiconductor substrate. In one example, the composite may include, for example, another semiconductor material, and the another semiconductor material may include, for example, moving in a direction away from the substrate, from about 0% to about 30% of the composite.

In one example, creating the layer of strained semiconductor material in the method of the first aspect may include, for example, creating an ungraded layer of a composite semiconductor material including a material of the bulk semiconductor substrate and another semiconductor material, the another semiconductor material including, for example, about 15% of the composite.

In one example, the slits in the method of the first aspect may create, for example, a hash pattern. In one example, where the slits create a hash pattern, the layer of strained semiconductor material may have, for example, a thickness of from about 50 nm to about 150 nm, each pillar having a non-zero width of less than about 100 nm, and the slits having a width of from about 5 nm to about 20 nm. In another example where the slits create a hash pattern, the shaped pillars may have, for example, a square shape, the substrate having an orientation of (100), and the pillar sidewalls having an orientation of (110). In yet another example where the slits create a hash pattern, the hash pattern may be, for example, rotated about 45 degrees with respect to an orientation notch in the substrate in order to facilitate a subsequent substantially defect-free merging of epitaxial semiconductor material, the shaped pillars having, for example, a square shape, the substrate having, for example, an orientation of (100), and the pillar sidewalls having, for example, an orientation of (100).

In one example, the plurality of shaped pillars in the method of the first aspect may have, for example, a circle shape.

In one example, the plurality of shaped pillars in the method of the first aspect may have, for example, a hexagon shape.

In one example, the merging in the method of the first aspect may include, for example, creating a layer of epitaxial composite semiconductor material on the plurality of pillars. In one example, the method may include, for example, planarizing the layer of epitaxial composite semiconductor material on the plurality of pillars to create a planarized continuous surface. In one example, the method may further include, for example, creating an additional layer of the epitaxial composite semiconductor material on the planarized continuous surface. In one example, the planarized layer of epitaxial composite semiconductor material and the additional layer together may have a thickness of, for example, from about 100 nm to about 200 nm.

In one example, the method of the first aspect may further include, for example, creating a layer of strained semiconductor channel material on the virtual relaxed substrate. In one example, the layer of strained semiconductor channel material may include, for example, tensily strained silicon having a thickness of from about 25 nm to about 50 nm. In another example, the additional layer of epitaxial composite semiconductor material may include, for example, silicon germanium, and the layer of strained semiconductor channel material may include, for example, compressively strained silicon germanium having a thickness of from about 25 nm to about 50 nm and a higher percentage of germanium than the additional layer of epitaxial composite semiconductor material, for example, about 10% to about 30% higher percentage of germanium.

In a second aspect, disclosed above is an intermediate semiconductor device. The device includes a bulk semiconductor substrate, and shaped pillars separated by slits reaching into the substrate and sized to achieve elastic edge effect relaxation throughout each shaped pillar, the shaped pillars including strained semiconductor material having a non-zero lattice mismatch of less than about 2% with the substrate, the shaped pillars having a thickness of about 50 nm to about 150 nm, and a top portion of the pillars being merged to create a continuous surface while substantially maintaining the slits. The device further includes a virtual relaxed substrate including a layer of epitaxial composite semiconductor material over the continuous surface.

In one example, the intermediate semiconductor device may further include, for example, a layer of strained semiconductor channel material on the virtual relaxed substrate.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising;
providing a bulk semiconductor substrate;
creating a layer of strained semiconductor material on the substrate, wherein a non-zero lattice mismatch of less than about 2% is present between the substrate and the layer of strained semiconductor material, and wherein the layer of strained semiconductor material has a thickness of about 50 nm to about 150 nm;
etching through the layer of strained semiconductor material and into the substrate to create a plurality of shaped pillars separated by slits and sized to achieve elastic edge effect relaxation throughout each shaped pillar;
merging a top portion of the plurality of pillars to create a continuous surface while substantially maintaining the slits; and
creating a virtual relaxed substrate by creating a layer of epitaxial composite semiconductor material over the continuous surface.

2. The method of claim 1, wherein creating the layer of epitaxial composite semiconductor material over the continuous surface, comprises:
creating a first layer of epitaxial composite semiconductor material on the continuous surface;
planarizing the first layer of epitaxial composite semiconductor material; and
creating a second layer of epitaxial composite semiconductor material on the planarized first layer.

3. The method of claim 1, wherein creating the layer of strained semiconductor material comprises creating a graded layer of a composite semiconductor material, the composite comprising a material of the bulk semiconductor substrate.

4. The method of claim 3, wherein the composite comprises another semiconductor material, and wherein the another semiconductor material comprises, moving in a direction away from the substrate, from about 0% to about 30% of the composite.

5. The method of claim 1, wherein creating the layer of strained semiconductor material comprises creating an ungraded layer of a composite semiconductor material comprising a material of the bulk semiconductor substrate and another semiconductor material, the another semiconductor material comprising about 15% of the composite.

6. The method of claim 1, wherein the slits create a hash pattern.

7. The method of claim 6, wherein the layer of strained semiconductor material has a thickness of from about 50 nm to about 150 nm, wherein each pillar has a non-zero width of less than about 100 nm, and wherein the slits have a width of from about 5 nm to about 20 nm.

8. The method of claim 6, wherein the plurality of shaped pillars have a square shape, wherein the substrate has an orientation of (100), and wherein the pillar sidewalls have an orientation of (110).

9. The method of claim 6, wherein the hash pattern is rotated about 45 degrees with respect to an orientation notch in the substrate, wherein the plurality of shaped pillars have a square shape, wherein the substrate has an orientation of (100), and wherein the pillar sidewalls have an orientation of (100).

10. The method of claim 1, wherein the plurality of shaped pillars have a circle shape.

11. The method of claim 1, wherein the plurality of shaped pillars have a hexagon shape.

12. The method of claim 1, wherein the merging comprises creating a layer of epitaxial composite semiconductor material on the plurality of pillars.

13. The method of claim 12, further comprising planarizing the layer of epitaxial composite semiconductor material on the plurality of pillars to create a planarized continuous surface.

14. The method of claim 13, further comprising creating an additional layer of the epitaxial composite semiconductor material on the planarized continuous surface.

15. The method of claim 14, wherein the planarized layer of epitaxial composite semiconductor material and the additional layer together have a thickness of from about 100 nm to about 200 nm.

16. The method of claim 1, further comprising creating a layer of strained semiconductor channel material on the virtual relaxed substrate.

17. The method of claim 16, wherein the layer of strained semiconductor channel material comprises tensily strained silicon having a thickness of from about 25 nm to about 50 nm.

18. The method of claim 16, wherein the layer of epitaxial composite semiconductor material comprises silicon germanium, and wherein the layer of strained semiconductor channel material comprises compressively strained silicon germanium having a thickness of from about 25 nm to about 50 nm and a 10-30% higher percentage of germanium than the layer of epitaxial composite semiconductor material.

19. An intermediate semiconductor device, comprising:
a bulk semiconductor substrate;
a plurality of shaped pillars separated by slits reaching into the substrate and sized to achieve elastic edge effect relaxation throughout each shaped pillar, wherein the plurality of shaped pillars comprise strained semiconductor material having a non-zero lattice mismatch of less than about 2% with the substrate, wherein the plurality of shaped pillars have a thickness of about 50 nm to about 150 nm, and wherein a top portion of the plurality of pillars is merged to create a continuous surface while substantially maintaining the slits; and
a virtual relaxed substrate comprising a layer of epitaxial composite semiconductor material over the continuous surface.

20. The intermediate semiconductor device of claim 19, further comprising a layer of strained semiconductor channel material on the virtual relaxed substrate.

* * * * *